(12) United States Patent
Park

(10) Patent No.: US 9,397,198 B2
(45) Date of Patent: Jul. 19, 2016

(54) METHOD OF MANUFACTURING SEMICONDUCTOR DEVICE HAVING FIN GATE

(71) Applicant: SK hynix Inc., Gyeonggi-do (KR)

(72) Inventor: Nam Kyun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/952,592

(22) Filed: Nov. 25, 2015

(65) Prior Publication Data

US 2016/0079398 A1    Mar. 17, 2016

Related U.S. Application Data

(60) Division of application No. 14/460,204, filed on Aug. 14, 2014, now Pat. No. 9,231,055, which is a continuation-in-part of application No. 14/074,404, filed on Nov. 7, 2013, now Pat. No. 9,054,033.

(30) Foreign Application Priority Data

Aug. 19, 2013 (KR) .................. 10-2013-0097806
Apr. 28, 2014 (KR) .................. 10-2014-0050648

(51) Int. Cl.

| H01L 21/3205 | (2006.01) |
| H01L 29/66 | (2006.01) |
| H01L 29/10 | (2006.01) |
| H01L 29/78 | (2006.01) |
| H01L 27/24 | (2006.01) |
| H01L 29/161 | (2006.01) |
| H01L 27/22 | (2006.01) |

(52) U.S. Cl.
CPC ........ *H01L 29/66795* (2013.01); *H01L 27/228* (2013.01); *H01L 27/2436* (2013.01); *H01L 29/1054* (2013.01); *H01L 29/161* (2013.01); *H01L 29/785* (2013.01); *H01L 29/7842* (2013.01)

(58) Field of Classification Search
CPC ............................. H01L 21/762; H01L 29/78
USPC ........................................ 438/585; 257/365, 2
See application file for complete search history.

(56) References Cited

U.S. PATENT DOCUMENTS

| 8,237,226 B2* | 8/2012 | Okano ................ H01L 21/324 257/368 |
| 8,946,670 B1* | 2/2015 | Park .................... H01L 27/2436 257/2 |
| 2007/0295995 A1* | 12/2007 | Yun ................... H01L 27/10885 257/202 |
| 2008/0296632 A1* | 12/2008 | Moroz ............ H01L 21/823807 257/255 |
| 2009/0032849 A1* | 2/2009 | Higashino ........... H01L 29/7827 257/262 |
| 2009/0085062 A1* | 4/2009 | Jin .................... H01L 29/66795 257/190 |
| 2009/0166725 A1* | 7/2009 | Lee ...................... H01L 29/7827 257/329 |
| 2009/0256208 A1* | 10/2009 | Okano ................. H01L 21/324 257/365 |

(Continued)

*Primary Examiner* — Caleb Henry
(74) *Attorney, Agent, or Firm* — IP & T Group LLP

(57) ABSTRACT

A semiconductor device having a fin gate that improves an operation current, and a method of manufacturing the same. The semiconductor device includes an active pillar formed on a semiconductor substrate, the active pillar including an inner region and an outer region surrounding the inner region, and a fin gate overlapping an upper surface and a lateral surface of the active pillar. The inner portion of the active pillar includes a first semiconductor layer having a first lattice constant, and the outer region of the active pillar includes a second semiconductor layer having a second lattice constant smaller than the first lattice constant.

6 Claims, 8 Drawing Sheets

(56) References Cited

U.S. PATENT DOCUMENTS

| | | | |
|---|---|---|---|
| 2009/0294845 A1* | 12/2009 | Inagawa | H01L 29/7827 257/330 |
| 2010/0127327 A1* | 5/2010 | Chidambarrao | H01L 29/66795 257/347 |
| 2010/0140688 A1* | 6/2010 | Fujimoto | H01L 21/823437 257/329 |
| 2010/0187578 A1* | 7/2010 | Faltermeier | H01L 29/66636 257/288 |
| 2010/0207172 A1* | 8/2010 | Masuoka | H01L 21/823807 257/255 |
| 2010/0219482 A1* | 9/2010 | Masuoka | H01L 21/845 257/369 |
| 2010/0264485 A1* | 10/2010 | Masuoka | H01L 29/42356 257/329 |
| 2011/0073952 A1* | 3/2011 | Kwok | H01L 29/045 257/368 |
| 2011/0186797 A1* | 8/2011 | Herner | G11C 17/16 257/2 |
| 2012/0056256 A1* | 3/2012 | Mikasa | H01L 27/10876 257/296 |
| 2012/0056264 A1* | 3/2012 | Anderson | H01L 29/66795 257/347 |
| 2012/0080742 A1* | 4/2012 | Fujimoto | G11C 11/404 257/329 |
| 2013/0037869 A1* | 2/2013 | Okano | H01L 29/66795 257/288 |
| 2013/0181274 A1* | 7/2013 | Saitoh | H01L 29/78 257/314 |
| 2013/0234204 A1* | 9/2013 | Kang | H01L 29/7851 257/190 |
| 2014/0061778 A1* | 3/2014 | Myung | H01L 29/41741 257/329 |
| 2014/0061815 A1* | 3/2014 | Jagannathan | H01L 27/0924 257/369 |
| 2014/0084342 A1* | 3/2014 | Cappellani | B82Y 10/00 257/192 |
| 2014/0361233 A1* | 12/2014 | Kim | H01L 29/66666 257/2 |
| 2014/0374827 A1* | 12/2014 | Suh | H01L 29/785 257/347 |
| 2015/0014775 A1* | 1/2015 | Seo | H01L 23/5286 257/351 |
| 2015/0048292 A1* | 2/2015 | Park | H01L 27/2454 257/2 |
| 2015/0048294 A1* | 2/2015 | Park | H01L 27/2454 257/2 |
| 2015/0048295 A1* | 2/2015 | Park | H01L 27/228 257/2 |
| 2015/0048296 A1* | 2/2015 | Park | H01L 27/228 257/2 |
| 2015/0091070 A1* | 4/2015 | Cho | H01L 29/41741 257/306 |
| 2015/0123193 A1* | 5/2015 | Masuoka | H01L 21/2251 257/329 |
| 2015/0123210 A1* | 5/2015 | Liao | H01L 29/785 257/401 |
| 2015/0137263 A1* | 5/2015 | Lee | H01L 29/66795 257/401 |
| 2015/0144880 A1* | 5/2015 | Rachmady | H01L 29/42392 257/24 |
| 2015/0243666 A1* | 8/2015 | Shimamoto | H01L 27/10823 257/296 |
| 2015/0243707 A1* | 8/2015 | Park | H01L 27/2454 257/2 |

* cited by examiner

METHOD OF MANUFACTURING SEMICONDUCTOR DEVICE HAVING FIN GATE

CROSS-REFERENCES TO RELATED APPLICATION

This application is a division of U.S. patent application Ser. No. 14/460,204 filed on Aug. 14, 2014, which is a continuation-in-part of application Ser. No. 14/074,404, filed Nov. 7, 2013, now U.S. Pat. No. 9,054,033, titled "Semiconductor Device Having a Vertical Channel, Variable Resistive Memory Device Including the Same and Method of Manufacturing The Same" and claims priority under 35 U.S.C. 119(a) to Korean applications No. 10-2013-0097806, filed on Aug. 19, 2013 and No. 10-2014-0050648, filed on Apr. 28, 2014, in the Korean intellectual property Office. The disclosures of each of the foregoing applications which are incorporated by reference in its entirety as set forth in full.

BACKGROUND

1. Technical Field

Exemplary implementations relate to a semiconductor device and a method of manufacturing the same, and more particularly, to a semiconductor device having a fin gate, a resistive memory device including the same, and a method of manufacturing the same.

2. Related Art

With the rapid development of mobile and digital information communication and the consumer-electronics industry, electronic charge controlled-devices may encounter limitations. Thus, new functional memory devices need to be developed. In particular, next-generation memory devices with large capacities, ultra-high speeds, and ultra-low powers need to be developed to satisfy demands of large capacity memories.

Resistive memory devices using a resistance device as a memory medium have been suggested as the next-generation of memory devices. Examples of variable resistance memory device may include phase-change random access memories (PCRAMs), resistive RAMs (ReRAMs), or magento resistive RAMs (MRAMs).

A resistive memory device may be formed of a switching device and a resistance device and may store data "0" or "1," according to a state of the resistance device.

Even in the variable resistive memory device, the first priority is to improve integration density and to integrate as many memory cells as possible in a limited and small area.

To satisfy the demands, the resistive memory devices also employ a three-dimensional (3D) transistor structure. The 3D transistors may include a 3D vertical channel and a surrounded gate, or include a 3D horizontal channel and a fin gate.

The 3D transistors may require a high operation current to maintain high resistance variable characteristics.

SUMMARY

An exemplary semiconductor device may include an active pillar formed on a semiconductor substrate, the active pillar including an inner region and an outer region surrounding the inner region, and a fin gate overlapping an upper surface and a lateral surface of the active pillar, wherein the inner portion of the active pillar includes a first semiconductor layer having a first lattice constant, and the outer region of the active pillar includes a second semiconductor layer having a second lattice constant smaller than the first lattice constant.

An exemplary resistive memory device may include an active pillar including a first semiconductor layer to form a channel region, and a second semiconductor layer surrounding the first semiconductor layer, a source region located at an end of the channel region, a drain region located at an opposite end of the channel region, a fin gate formed around an upper surface and a lateral surface of the channel region, a gate insulating layer interposed between the active pillar and the fin gate, and a variable resistor electrically connected to the drain, wherein a difference between a lattice constant of the first semiconductor layer and a lattice constant of the second semiconductor layer causes tensile stress in a region where the first semiconductor layer and the second semiconductor layer are interfaced.

An exemplary method of manufacturing a semiconductor device may include forming an active pillar on a semiconductor substrate, wherein a material forming an inner portion of the active pillar has a lattice constant larger than a lattice constant of a material forming an outer portion of the active pillar; forming a gate insulating layer on a surface of the active pillar; and forming a fin gate on the gate insulating layer to surround three surfaces of the active pillar.

These and other features, aspects, and implementations are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1A:
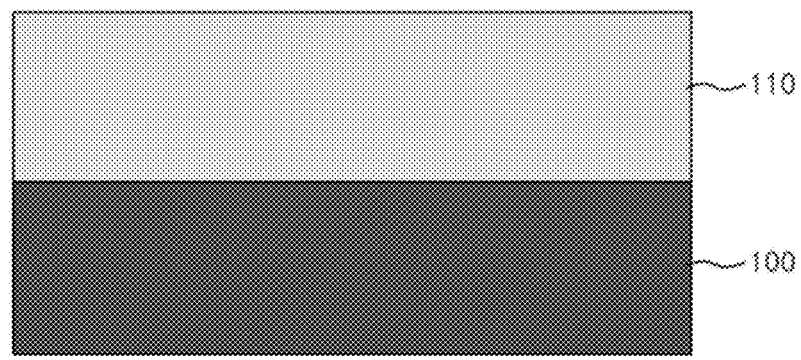
FIGS. 1A to 1D are cross-sectional views illustrating an exemplary method of manufacturing a semiconductor device having a fin gate.

Hereinafter, exemplary implementations will be described in greater detail with reference to the accompanying drawings. Exemplary implementations are described herein with reference to cross-sectional illustrations that are schematic illustrations of exemplary implementations (and intermediate structures). As such, variations from the shapes of the illustrations as a result, for example, of manufacturing techniques and/or tolerances, are to be expected. Thus, exemplary implementations should not be construed as limited to the particular shapes of regions illustrated herein but may be to include deviations in shapes that result, for example, from manufacturing. In the drawings, lengths and sizes of layers and regions may be exaggerated for clarity. Throughout the disclosure, reference numerals correspond directly to the like numbered parts in the various figures and embodiments of the present invention. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

The exemplary inventive concept is described herein with reference to cross-section and/or plan illustrations that are schematic illustrations of idealized implementations of the inventive concept. However, implementations of the inventive concept should not be limited construed as limited to the inventive concept. Although a few implementations of the inventive concept will be shown and described, it will be appreciated by those of ordinary skill in the art that changes may be made in these exemplary implementations without departing from the principles and spirit of the exemplary inventive concept.

Referring to FIG. 1A, a semiconductor substrate 100 is prepared. The semiconductor substrate 100 may be, for example, a silicon (Si) substrate containing a first conductivity type impurity, such as a P-type impurity. A first semiconductor layer 110 is deposited on the semiconductor substrate 100, The first semiconductor layer 110 may be formed of a material having a lattice constant larger than that of the semiconductor substrate 100. In an exemplary implementation, the first semiconductor layer 110 may include, for example, silicon germanium (Site), gallium arsenide (GaAs), indium arsenide (InAs), gallium antimonide (GaSb), indiumantimonide (InSb), indium phosphide (InP), magnesium sulfide (MgS), magnesium selenide (MgSe), masurium telluride (MaTe), zinc sulfide (ZnS), zinc selenide (ZnSe), zinc telluride (ZnTe), aluminum phosphide (AlP), gallium phosphide (GaP), aluminum arsenide (AlAs), aluminum antimonide (AlSb), cadmium sulfide (CdS), cadmium antimonide (CdSb), or cadmium telluride (CdTe). The first semiconductor layer 110 may be a region in which a channel is to be formed in a subsequent process. A thickness of the first semiconductor layer 110 may be based on a length of the channel. That is, since the first semiconductor layer 110 will become the channel of the MOS transistor, the thickness of the first semiconductor layer 110 is based on a desired channel length. The first semiconductor layer 110 may be grown, for example, in a single crystalline structure through an epitaxial growth method. As the first semiconductor layer 110 is formed through an epitaxial growth method, a carrier mobility characteristic may be improved as compared to a semiconductor layer having a polycrystalline structure.

Figure 1B:
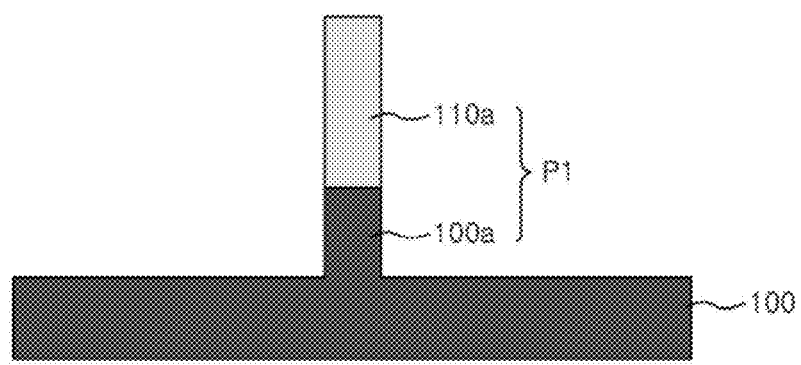

Referring to FIG. 1B, the first semiconductor layer 110 and a portion of the semiconductor substrate 100 are patterned to form a preliminary pillar P1. The reference numeral 110a denotes a patterned first semiconductor layer, and 100a denotes a patterned portion of the semiconductor substrate. In an exemplary implementation, the preliminary pillar P1 may extend substantially perpendicular to a surface of the semiconductor substrate 100.

Figure 1C:
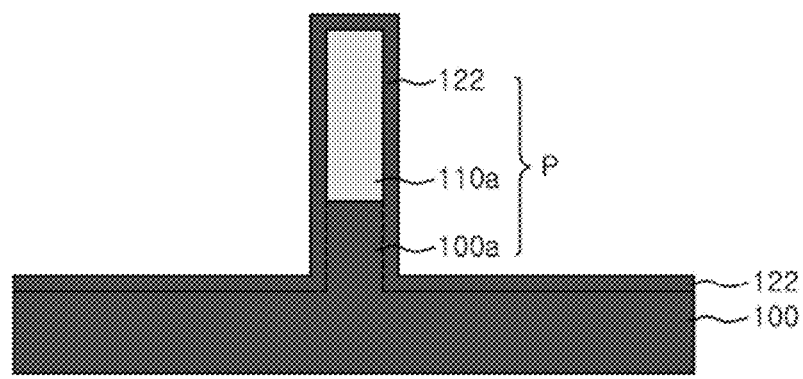

Referring to FIG. 1C, a second semiconductor layer 122 is formed on the semiconductor substrate 100 and on the preliminary pillar P1. The second semiconductor layer 122 may be formed of the same material as the semiconductor substrate 100, for example, a silicon (Si) material. The second semiconductor layer 122 may be formed through an epitaxial growth method.

Figure 1D:
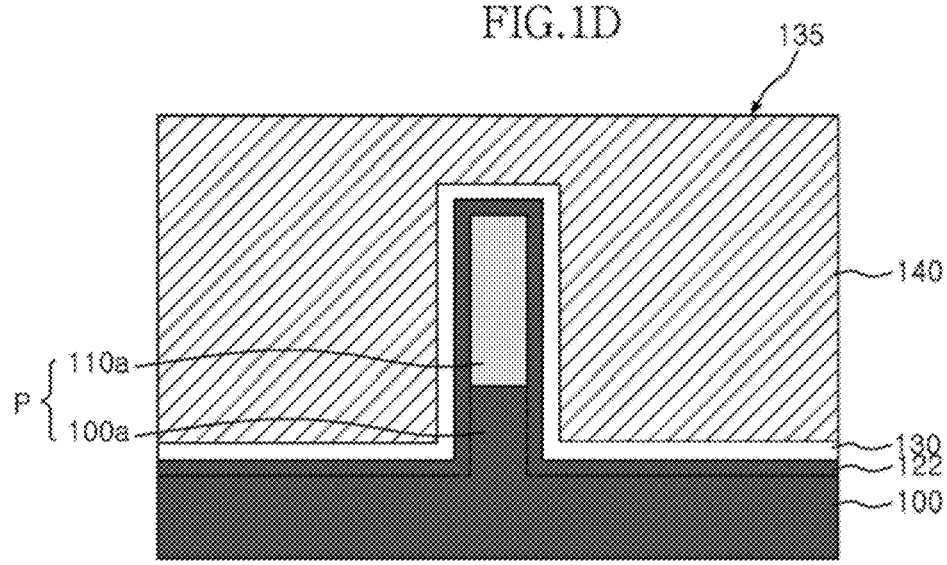

Referring to FIG. 1D, a gate insulating layer 130 and a gate conductive material 135 are deposited on the second semiconductor layer 122. The gate insulating layer 130 may be formed through an oxidation process of the second semiconductor layer 122. The gate insulating layer 130 may be formed by depositing a metal oxide, such as tantalum oxide (TaO), titanium oxide (TiO), barium titanate (BaTiO), barium zirconate (BaZrO), zirconium oxide (ZrO), hafnium oxide (HfO), lanthanum oxide (LaO), aluminum oxide (AlO), yttrium oxide (YO), or zirconium silicon oxide (ZrSiO), nitride, or a combination thereof. The gate conductive material 135 may include, for example, tungsten (W), copper (Cu), titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN) titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN) tantalum silicon nitride (TaSiN), tantalum aluminum nitride (TaAlN), titanium (Ti), molybdenum (Mo), tantalum (Ta), titanium silicide (TiSi), tantalum silicide (TaS), titanium tungsten (TAN), titanium oxynitride (TiON), titanium aluminum oxynitride (TiAlON), tungsten oxynitride (WON), tantalum oxynitride (TaON) or doped polysilicon.

Figure 2:
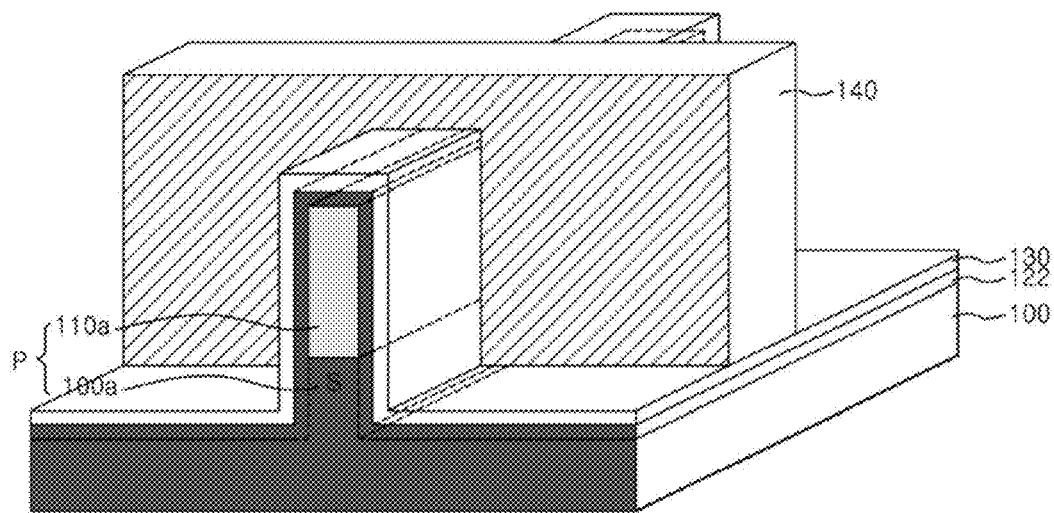
FIG. 2 is a perspective view illustrating an exemplary semiconductor device having a fin gate manufactured according to the exemplary method.

Referring to FIG. 2, the gate conductive material 135 is patterned to form a fin gate 140 crossing the active pillar P. When the gate conductive material 135 is patterned, the gate insulating layer 130 may be simultaneously patterned. Thus, the fin gate 140 may overlap an upper surface and both lateral surfaces of the active pillar P.

A second conductivity type impurity, for example, a high concentration N-type impurity, is implanted into the active pillar P at both sides of the fin gate 140 to form a source S at one side of the active pillar P and a drain D at the other side of the active pillar P, with respect to the fin gate 140. The source S and the drain D may be formed in a lightly doped drain (LDD) manner to reduce a short channel effect such as gate-induced drain leakage (GIDL).

When a variable resistive memory device is implemented, a bit line and a variable resistor may be formed to be electrically coupled to the drain D through a known method.

In the 3D transistor having the fin gate 140, a tensile stress may be caused in a junction interface between an inner portion of the active pillar P and an outer portion about the active pillar P, because of a lattice constant difference resulting from a lattice constant of the semiconductor material in the inner portion of the active pillar P being larger than a lattice contact of the semiconductor material in the outer portion. When the tensile stress is caused, an electron mobility of the NMOS transistor may increase in the inner portion of the active pillar P, Thus, current drivability of the NMOS transistor may be improved.

An alternative exemplary method of manufacturing a semiconductor device having a fin gate will be described with reference to FIGS. 3A to 3E.

Figure 3A:
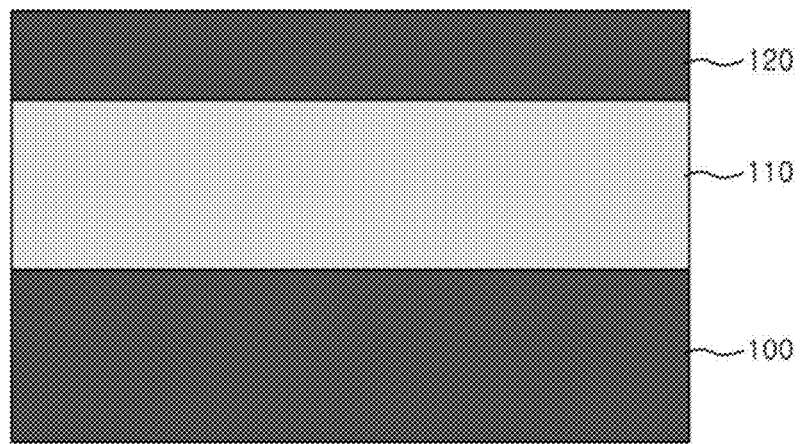
FIGS. 3A to 3E are cross-sectional views illustrating an exemplary method of manufacturing a semiconductor device having a fin gate.

Referring to FIG. 3A, a semiconductor substrate 100 is prepared. The semiconductor substrate 100 may be, for example, a silicon (Si) substrate containing first conductivity type impurities, such as a P-type impurity. A first semiconductor layer 110 and a second semiconductor layer 120 are sequentially deposited on the semiconductor substrate 100. The first semiconductor layer 110 may be formed of a material having a lattice constant larger than those of the semiconductor substrate 100 and the second semiconductor layer 120. In the exemplary implementation, the first semiconductor layer 110 may include SiGe, GaAs, InAs, GaSb, InSb, InP, MgS, MgSe, MaTe, ZnS, ZnSe, ZnTe, AlP, GaP, AlAs, AlSb, CdS, CdSe, or CdTe. The first semiconductor layer 110 may be a region in which a channel is to be formed in a subsequent process. A thickness of the first semiconductor layer 110 may be based on a length of the channel. That is, since the first semiconductor layer 110 will become the channel of the MOS transistor, the thickness of the first semiconductor layer 110 is based on a desired channel length. The first semiconductor layer 110 may be grown, for example, in a single crystalline structure through an epitaxial growth method. As the first semiconductor layer 110 is formed through an epitaxial growth method, a carrier mobility characteristic may be improved as compared to a semiconductor layer having a polycrystalline structure. The second semiconductor layer 120 may be formed of the same material as the semiconductor substrate 100, for example, a silicon (Si) material.

Figure 3B:
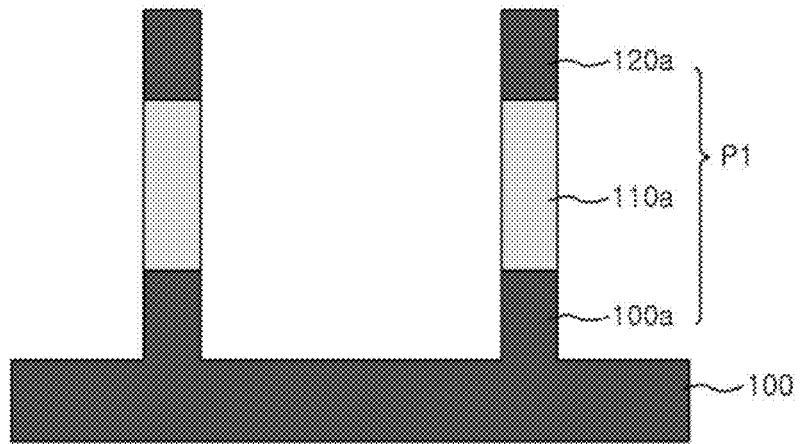

Referring to FIG. 3B, the second semiconductor layer 120, the first semiconductor layer 110, and a portion of the semiconductor substrate 100 are patterned to form a preliminary pillar P1 extending substantially perpendicular to a surface of the semiconductor substrate 100. The reference numeral 120a denotes a patterned second semiconductor layer, 110a denotes a patterned first semiconductor layer, and 100a denotes a patterned portion of the semiconductor substrate.

Figure 3C:
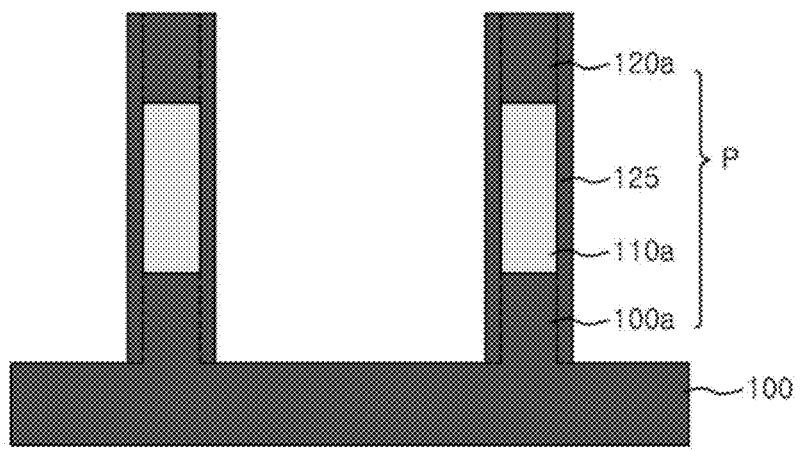
Figure 4:
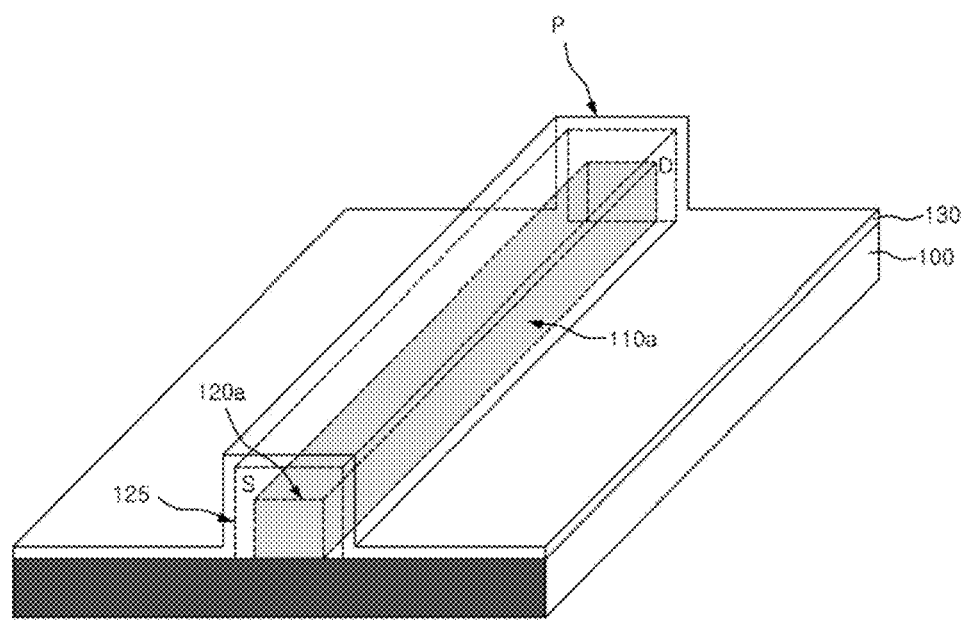
FIG. 4 is a perspective view illustrating an exemplary semiconductor device having a fin gate.

Referring to FIGS. 3C and 4, a third semiconductor layer 125 having a lattice constant smaller than that of the patterned first semiconductor layer 110a is formed on an outer circumference of the preliminary pillar P1 (see P1 of FIG. 3B). For example, the third semiconductor layer 125 may be formed of the same material (such as, a silicon (Si) material) as the semiconductor substrate 100 and the patterned second semiconductor layer 120a. The third semiconductor layer 125 may be formed using an epitaxial growth method. To form the third semiconductor layer 125, a surface of the patterned first semiconductor layer 110a may be enclosed with a semiconductor material (for example, a silicon (Si) material) having a smaller lattice constant than that of the patterned first semiconductor layer 110a. Therefore, an active pillar P, in which a 3D transistor is to be formed, is formed.

Figure 3D:
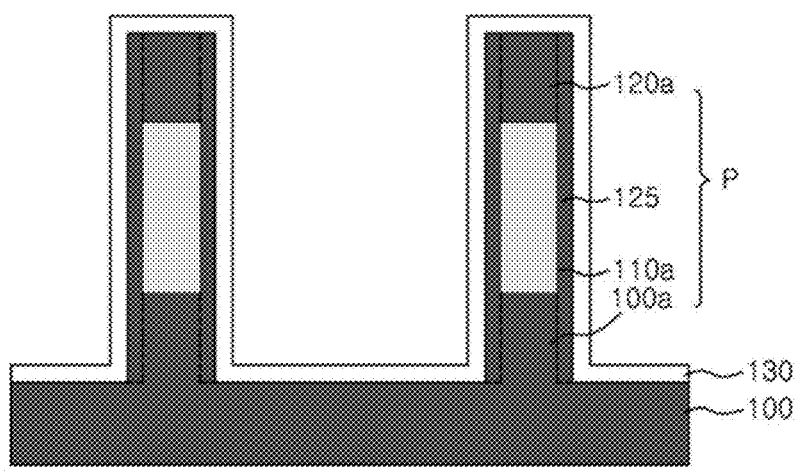

Referring to FIG. 3D, an oxidation process is performed on the active pillar P and the exposed surface of the semiconductor substrate 100 to form a gate insulating layer 130. Although, in an exemplary implementation, the gate insulating layer 130 is formed through an oxidation process, this is not limited thereto, and the gate insulating layer 130 may be formed through a deposition method. If the gate insulating layer 130 is formed through a deposition method, then the gate insulating layer 130 may include a metal oxide, such as TaO, TiO, BaTiO, BaZrO, ZrO, HfO, LaO, AlO, YO or ZrSiO, nitride, or a combination thereof. In some cases, the gate insulating layer 130 may be formed to be thicker on the surface of the semiconductor substrate 100 than on a surface of the active pillar P.

Figure 3E:
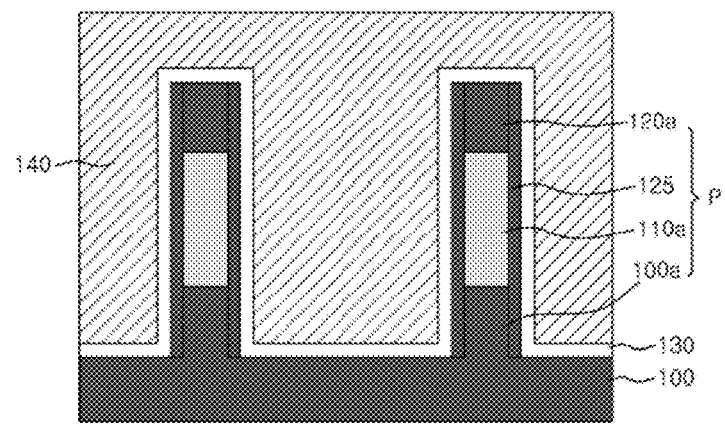

Referring to FIGS. 3E and 4, a gate conductive material 135 may be deposited on the semiconductor substrate 100 in which the gate insulating layer 130 is formed. The gate conductive material may include, for example, W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti, Mo, Ta, TiSi, TaSi, TiW, TiON, TiAlON, WON, TaON, or doped polysilicon.

Figure 5:
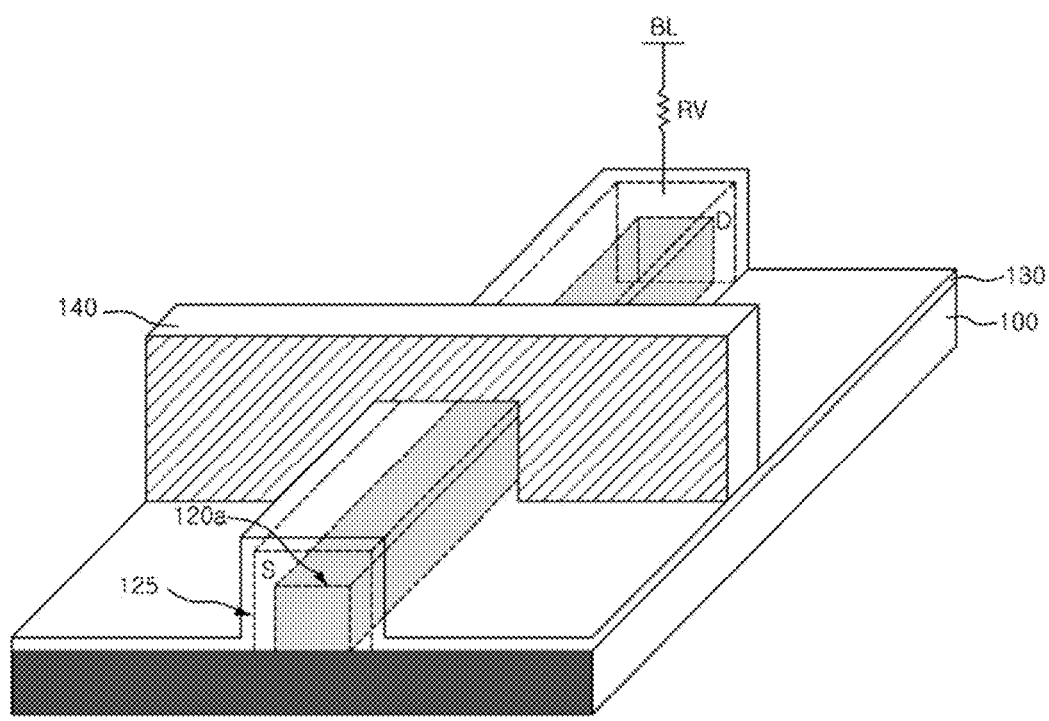
FIG. 5 is a perspective view illustrating an exemplary variable resistive memory device having a fin gate.

The gate conductive material 135 may be patterned to form a fin gate 140. As illustrated in FIG. 5, the fin gate 140 may be formed to overlap an upper surface and a lateral surface of the active pillar P covered with the gate insulating layer 130.

Subsequently, a source 5, a drain D, a variable resistor Rv, and a bit line BL may be formed through a known method to manufacture a variable resistive memory device, including the semiconductor device.

The inventive concept is not limited to the above-described implementations.

Figure 6:
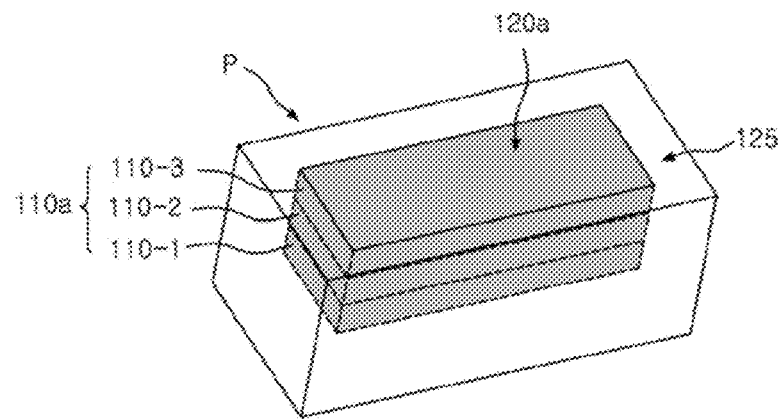
FIGS. 6 to 8 are cross-sectional views illustrating exemplary pillars of semiconductor devices having a fin gate.

In an exemplary implementation illustrated in FIG. 6, a patterned first semiconductor layer 110a of an active pillar P may include a first semiconductor sub-layer 110-1, a second semiconductor sub-layer 110-2, and a third semiconductor sub-layer 110-3. If the patterned first semiconductor layer 110a is formed of SiGe, then the first semiconductor sub-layer 110-1 and the third semiconductor sub-layer 110-3 may be SiGe layers which have a concentration of Ge that is less than a concentration of Ge that forms a stoichiometric ratio of SiGe (for example, referred to as low-Ge-concentration-SiGe layers), and the second semiconductor sub-layer 110-2 may be a SiGe layer which has a concentration of Ge that is greater than a concentration of Ge that forms a stoichiometric ratio of SiGe (for example, referred to as a high-Ge-concentration-SiGe layer). If the concentration of Ge in the SiGe layer is typically increased, then the lattice constant of the SiGe layer may increase. Therefore, a material having the largest lattice constant is formed in an effective channel zone of the patterned first semiconductor layer 110a to maximize electron mobility in the channel.

Figure 7:
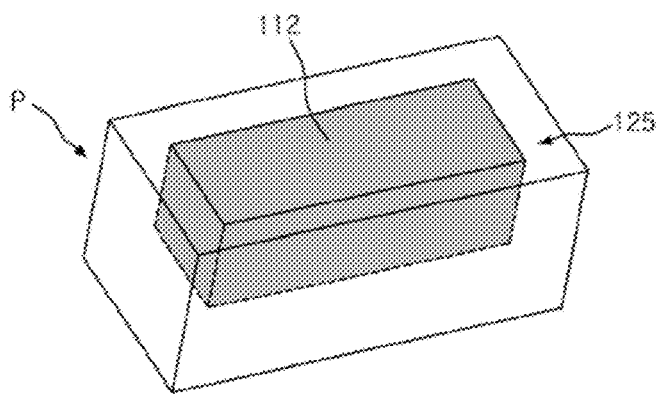

In an exemplary implementation shown in FIG. 7, an active pillar P may be formed to expose an upper surface of a patterned first semiconductor layer 112. Thus, the fin gate (see 140 of FIG. 5) and the patterned first semiconductor layer 112 may overlap each other with a gate insulating layer (not shown) being interposed therebetween.

Figure 8:
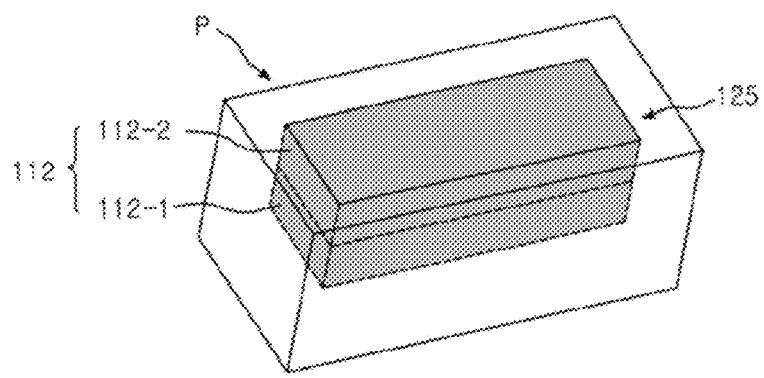

Further, when the upper surface of the patterned first semiconductor layer 110a becomes an upper surface of the active pillar P as illustrated in FIG. 7, the first semiconductor layer 112 may include a low-Ge-concentration-SiGe layer 112-1 and a high-Ge-concentration-SiGe layer 112-2 which are stacked as illustrated in FIG. 8.

According to the exemplary implementations, the inner portion of the pillar having the inner portion and the outer portion may be formed of a material having a larger lattice constant than that of the outer portion. Therefore, channel mobility of the NMOS transistor, that is, current drivability of the NMOS transistor may be improved remarkably according to application of tensile stress to the inner portion of the pillar.

Further, a gate electric field is applied from three surfaces of the channel through use of the fin gate, and thus operation characteristics of the MOS transistor may be further improved.

The above implementation of the present invention is illustrative and not limitative. Various alternatives and equivalents are possible. The invention is not limited by the implementation described herein. Nor is the invention limited to any specific type of semiconductor device. Other additions, subtractions, or modifications are obvious in view of the present disclosure and are intended to fall within the scope of the appended claims.

What is claimed is:
1. A method of manufacturing a semiconductor device, the method comprising:
   forming an active pillar on a semiconductor substrate, wherein a material forming an inner portion of the active pillar has a lattice constant larger than a lattice constant of a material forming an outer portion of the active pillar;
   forming a gate insulating layer on a surface of the active pillar; and
   forming a fin gate on the gate insulating layer to surround three surfaces of the active pillar, wherein the forming of the active pillar includes:
forming a first semiconductor layer on the semiconductor substrate, the first semiconductor layer having a lattice constant larger than a lattice constant of the semiconductor substrate;
forming a second semiconductor layer on the first semiconductor layer, the second semiconductor layer having a lattice constant substantially equal to the lattice constant of the semiconductor substrate; and
forming a preliminary pillar by patterning the first semiconductor layer and the semiconductor substrate.

2. The method of claim 1, wherein at least one of the semiconductor substrate or the second semiconductor layer includes a silicon (Si) material.

3. The method of claim 2, further comprising:
forming the first semiconductor layer or the second semiconductor layer via an epitaxial growth method.

4. The method of claim 1, wherein the first semiconductor layer includes SiGe, GaAs, InAs, GaSb, InSb, InP, MgS, MgSe, MaTe, ZnS, ZnSe, ZnTe, AlP, GaP, AlAs, AlSb, CdS, CdSe, or CdTe.

5. The method of claim 1, further comprising:
generating, based on a difference between the lattice constant of the first semiconductor layer and the lattice constant of the second semiconductor layer, a tensile stress in an interface region between the first semiconductor layer and the second semiconductor layer.

6. The method of claim 1, wherein the forming the active pillar further comprises:
forming a third semiconductor layer over the first semiconductor layer and the second semiconductor layer, the third semiconductor layer having a lattice constant that is less than the lattice constant of the first semiconductor layer.

* * * * *